(12) United States Patent
Davidson et al.

(10) Patent No.: US 10,867,582 B2
(45) Date of Patent: Dec. 15, 2020

(54) METHOD AND APPARATUS FOR GENERATING AN IMAGE

(71) Applicant: BAE SYSTEMS plc, London (GB)

(72) Inventors: Neil Turnbull Davidson, Rochester (GB); Ian Gray Rigge, Rochester (GB)

(73) Assignee: BAE Systems plc, London (GB)

( * ) Notice: Subject to any disclaimer, the term of this patent is extended or adjusted under 35 U.S.C. 154(b) by 28 days.

(21) Appl. No.: 16/075,235

(22) PCT Filed: Feb. 3, 2017

(86) PCT No.: PCT/GB2017/050270
§ 371 (c)(1),
(2) Date: Aug. 3, 2018

(87) PCT Pub. No.: WO2017/134451
PCT Pub. Date: Aug. 10, 2017

(65) Prior Publication Data
US 2019/0043455 A1 Feb. 7, 2019

(30) Foreign Application Priority Data
Feb. 5, 2016 (GB) .................................. 1602117.2

(51) Int. Cl.
*G09G 5/36* (2006.01)
*G06F 11/36* (2006.01)
(Continued)

(52) U.S. Cl.
CPC ............ *G09G 5/363* (2013.01); *G06F 3/147* (2013.01); *G06F 11/36* (2013.01); *G06F 30/00* (2020.01);
(Continued)

(58) Field of Classification Search
None
See application file for complete search history.

(56) References Cited

U.S. PATENT DOCUMENTS 6,233,540 B1 * 5/2001 Schaumont ............. G06F 30/33
703/14
7,075,681 B1 7/2006 Brothers
(Continued)

FOREIGN PATENT DOCUMENTS

WO 02/103292 A1 12/2002
WO 2008/048949 A2 4/2008
(Continued)

OTHER PUBLICATIONS

GB Search Report under Section 17(5) received for GB Application No. 1602120.6, dated Jul. 5, 2016. 3 pages.
(Continued)

*Primary Examiner* — Saptarshi Mazumder
(74) *Attorney, Agent, or Firm* — Finch & Maloney PLLC

(57) ABSTRACT

A method and apparatus are provided for generating image data for output to a display device such as a HUD or HMD for display and for the validating image data being output to an applicable standard. The image generator comprises an interfacing component, an image rendering component implementing at least one image rendering function and an integrity monitor. The interfacing component receives drawing commands from external systems defining an image to be displayed and derives rendering and other control commands according to a predefined command set recognisable by the image rendering component. The image rendering component generates a set of image data from received rendering commands in the predefined set. The integrity monitor includes a rendering simulator arranged to simulate the at least one image rendering function to generate a nominally identical set of image data from received drawing or rendering commands. The integrity monitor also includes a comparator to compare the image data generated by the simulator with that output by the image rendering component and to output the result of the comparison, so enabling (Continued)

action to be taken, e.g. temporarily to suspend output by the image generator, in the event of a discrepancy being detected in the design or implementation of the at least one image rendering function.

20 Claims, 6 Drawing Sheets

(51) Int. Cl.
  *G06F 3/147* (2006.01)
  *G09G 3/00* (2006.01)
  *G06F 30/00* (2020.01)
(52) U.S. Cl.
  CPC ......... *G09G 3/006* (2013.01); *G09G 2380/12* (2013.01)

(56) References Cited

U.S. PATENT DOCUMENTS

| | | | |
|---|---|---|---|
| 7,227,556 | B2 | 6/2007 | O'Driscoll |
| 9,430,036 | B1* | 8/2016 | Kominac ................ G06T 11/20 |
| 2004/0179018 | A1 | 9/2004 | Sabella et al. |
| 2005/0027988 | A1* | 2/2005 | Bodrov .................. G06F 21/51 |
| | | | 713/176 |
| 2007/0013693 | A1 | 1/2007 | Hedrick |
| 2007/0046680 | A1* | 3/2007 | Hedrick ................ G06T 15/005 |
| | | | 345/503 |
| 2008/0205853 | A1 | 8/2008 | Schroder et al. |
| 2010/0231600 | A1 | 9/2010 | Kaufman et al. |
| 2011/0074765 | A1 | 3/2011 | Oterhals et al. |
| 2012/0206447 | A1 | 8/2012 | Hutchins |
| 2012/0293545 | A1 | 11/2012 | Engh-Halstvedt et al. |
| 2014/0085324 | A1* | 3/2014 | Charvet ................ G06T 7/0004 |
| | | | 345/589 |
| 2014/0146075 | A1* | 5/2014 | Takasu ................. G02B 27/017 |
| | | | 345/619 |
| 2014/0375661 | A1 | 12/2014 | Koker et al. |
| 2015/0015588 | A1* | 1/2015 | Guy .......................... G06F 3/14 |
| | | | 345/501 |
| 2015/0188977 | A1* | 7/2015 | Berry .................... G06T 7/0002 |
| | | | 709/217 |
| 2015/0332429 | A1 | 11/2015 | Fernandez et al. |
| 2015/0348299 | A1 | 12/2015 | Ott |
| 2016/0077896 | A1 | 3/2016 | Bolz |
| 2017/0177458 | A1* | 6/2017 | Viggers ............... G06F 11/2236 |
| 2019/0066347 | A1 | 2/2019 | Davidson et al. |

FOREIGN PATENT DOCUMENTS

| | | |
|---|---|---|
| WO | 2017/134451 A1 | 8/2017 |
| WO | 2017/134452 A1 | 8/2017 |

OTHER PUBLICATIONS

International Search Report and Written Opinion received for PCT Application No. PCT/GB2017/050271, dated Apr. 20, 2017. 15 pages.
International Preliminary Report on Patentability received for PCT Application No. PCT/GB2017/050270, dated Aug. 16, 2018. 11 pages.
International Preliminary Report on Patentability received for PCT Application No. PCT/GB2017/050271, dated Aug. 16, 2018. 9 pages.
GB Search Report under Section 17(5) received for GB Application No. 1602117.2 dated Aug. 3, 2016. 3 pages.
International Search Report and Written Opinion received for PCT Application No. PCT/GB2017/050270, dated May 9, 2017. 17 pages.

* cited by examiner

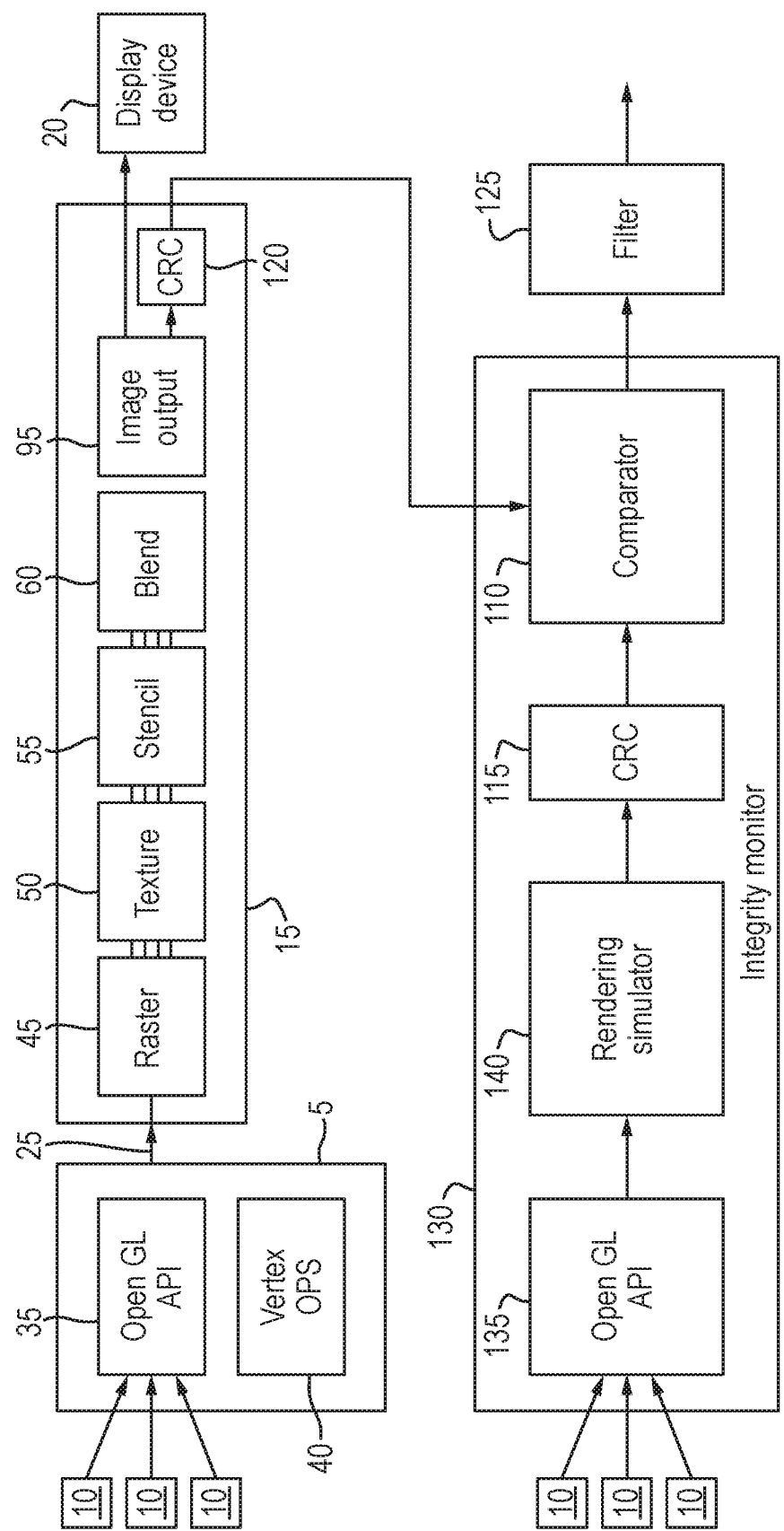

METHOD AND APPARATUS FOR GENERATING AN IMAGE

FIELD OF THE INVENTION

This invention relates to the generation of images for display. In particular, the invention may be applied to the generation of images for display by see-through displays, such as head-up displays (HUDs) and head or helmet-mounted displays (HMDs) in avionic applications subject to stringent tests of design assurance and reliability.

BACKGROUND TO THE INVENTION

Head-up display units (HUDs) and helmet-mounted display units (HMDs) display information in a user's field of vision without requiring the user to move his or her head. They are of particular use in safety-critical environments, for example in military aircraft cock-pits where it is desirable that the aircrew, and especially the pilot(s), are provided with flight-critical information without having to look at instruments or otherwise divert their line of sight from an external scene. As a display enhances or supplements the user's view of an external world scene, an important feature is that most of the display is see-through, so that the world view is not unduly obscured. The skilled person will be familiar with the type of avionic information and symbology typically included in images for display by HUDs and HMDs when used by aircraft pilots, for example. As such displays provide real-time information and symbology, image updates need to be generated for display at a high rate and with low latency.

Typically, image generators use a graphics processor unit (GPU) for image generation. While able to provide good performance, GPUs can be power-hungry, difficult to certify to the required design assurance level (DAL) and have a short lifespan as compared to typical avionic product life times of 25 or more years. This may result in obsolescence replacement programs, and expensive re-certification of the avionics following a design change.

When HUDs and HMDs are used in avionic and similar safety-critical applications, it is important that the probability of displaying hazardously misleading information is extremely low (typically between $<10^{-9}$ and $<10^{-12}$ failures per flight hour). It is common practice to provide one or more duplicate implementations of safety critical systems, so that an error in the operation of one of the implementations of the system will be detected by comparison with the one or more others. Whatever the implementation solution, rigorous standards are applied and later enforced by the relevant certification authorities and achievement of certification is generally more expensive the more complex the implementation. For avionics applications the applicable standards, as published by the Radio Technical Commission for Aeronautics (RTCA) Incorporated, are DO-254 in respect of complex electronic hardware and DO-178B/C in respect of software. Both standards have 5 levels of Design Assurance Level (DAL) from DAL A (the highest) down to DAL E. DAL A is typically applied to a primary flight instrument, whereas DAL C may be applied to a secondary instrument; the applicable DAL level depending upon the effect on the aircraft operation of a failure.

An implementation for an image generator is therefore required that combines relative ease of certification to the required standards using an implementation that is also capable of satisfying necessary performance requirements. Performance requirements may include not exceeding a particular overall latency in an associated display system from receipt of data to be displayed to visibility of updated imagery on the display device.

SUMMARY OF THE INVENTION

According to a first aspect, the present invention provides an image generator, comprising:
an interfacing component;
an image rendering component implementing at least one image rendering function; and
an integrity monitor,
wherein the interfacing component provides a first interface for receiving drawing commands defining an image to be displayed and for deriving therefrom rendering commands according to a predefined command set for output over a second interface to the image rendering component and
the image rendering component is arranged to generate and to output a set of image data from received rendering commands in the predefined set,
the integrity monitor, comprising:
a rendering simulator arranged to simulate the at least one image rendering function to generate a set of image data corresponding to at least a portion of a set of image data output by the image rendering component from received drawing or rendering commands; and
a comparator, arranged to receive a set of image data output by the rendering simulator and a corresponding set of image data output by the image rendering component, to compare the received sets of image data and to output the result of the comparison thereby to enable any discrepancy in the implemented at least one image rendering function to be identified.

By simulating only the image rendering functionality of an image rendering component whose functionality extends beyond merely the implementation of drawing functions, an integrity monitor is able to check that what a user sees is what input systems submitting drawing commands intended should be displayed. A particular advantage of such an implementation is that the simpler integrity monitor may be subject to the most stringent level of design approval while the more complex image rendering component need only be certified to a lesser level of integrity.

In an example embodiment, the rendering simulator is arranged to generate a set of image data corresponding, with bit-accuracy as intended by the at least one image rendering function, to the at least a portion of a set of image data output by the image rendering component. This may be enabled, in example implementations of the present invention described herein, through the implementation of the at least one image rendering function using an image rendering component comprising a programmable logic device in which all the mathematical details of the at least one image rendering function have been defined using a common set of design knowledge.

In particular, the rendering simulator is arranged to generate a set of image data corresponding, with bit-accuracy as intended by the at least one image rendering function, to a set of image data for the entire image as output by the image rendering component from the received drawing or rendering commands.

In an example embodiment, upon identifying a discrepancy, the output of the image rendering component is disabled for a predetermined period of time following identification of the discrepancy. The duration of any period during which output of the image rendering component is disabled depends upon the maximum allowable time period for which false information may be displayed for a given application.

In a further example embodiment, the drawing commands received by the interfacing component relate to a single image frame period. In this context, the integrity monitor is arranged to receive drawing commands as received by or rendering commands as output by the interfacing component in respect of selected image frame periods and the comparator is arranged to receive sets of image data output by, or derived from output by, the image rendering module in respect of the same selected image frame periods.

By validating image data generated only over selected frame periods, the integrity monitor is not required to render images at the same rate as the image rendering component. Instead, frame periods in which to validate the image data output by the image rendering component are selected with sufficient frequency as to ensure that falsely generated imagery is not displayed for longer than the maximum permitted period.

In an example embodiment, the sets of image data received by the comparator comprise respective cyclic redundancy check (CRC) values or digital signatures calculated on output by the rendering simulator and on output by the image rendering component. Furthermore, the integrity monitor further comprises a module for calculating a CRC value or digital signature on output by the rendering simulator and the image rendering component further comprises, or is arranged to output to, a corresponding module for calculating a CRC value or digital signature on output by the at least one image rendering function.

A CRC value or digital signature may be calculated very quickly for a set of image data and provides a rapid way to identify any difference between two data sets without needing to perform a bit-by-bit comparison.

In an example embodiment, the rendering simulator is arranged to receive the drawing commands as received by the interfacing component and to simulate functionality of the interfacing component in addition to that of the at least one image rendering function. In this way, the integrity monitor is able to validate the end-to-end image generating functionality of the image generating apparatus of the present invention.

To meet one aspect of the applicable standards on safety in operation, the time period between successive outputs by the integrity monitor of the results of comparisons for the selected image frame periods is less than a predetermined time period. This ensures than any falsely generated imagery does not remain displayed for longer than the predetermined time period, as defined according to the applicable standard for the given application.

In an example embodiment, the interfacing component is arranged to receive drawings commands in a selected subset of drawing commands defined in a predefined graphics standard and wherein the at least one image rendering function implements only the rendering functionality necessary to generate images definable using the selected subset of drawing commands.

In this way, the range of image rendering functionality that needs to be simulated is reduced to a minimum for the particular application of the present invention, so minimising the cost of certifying the design of the integrity monitor as a whole.

In an example implementation, the interfacing component and the integrity monitor are implemented using computer programs executable on a digital processor and the image rendering component is implemented as a firmware component using a programmable logic device.

According to a second aspect of the present invention, providing similar advantages to those provided by the equivalent features of the image generator defined according to the first aspect of the invention, above, there is provided a method for validating image rendering functionality of an image generator having an interfacing component for receiving drawing commands defining an image to be displayed and for deriving therefrom rendering commands in a predefined set for output to an image rendering component implementing at least one type of image rendering function to generate image data for the image to be displayed, the method comprising the steps:

(i) receiving drawing commands or rendering commands defining an image to be displayed;
(ii) simulating the at least one type of image rendering function to generate from the drawing or rendering commands received at step (i) image data corresponding to those generated by the at least one type of image rendering function;
(iii) comparing the image data generated by the rendering simulator with corresponding image data generated by the at least one type of image rendering function; and
(iv) outputting the result of the comparison thereby to enable identification of any discrepancy in the implemented at least one type of image rendering function.

In an example embodiment of the method, at step (ii), simulating the at least one type of image rendering function comprises generating image data with bit-accuracy, as intended by the at least one type of image rendering function, corresponding to the at least a portion of those generated by the at least one type of image rendering function. In particular, at step (ii), simulating the at least one type of image rendering function comprises generating image data with bit-accuracy, as intended by the at least one type of image rendering function, corresponding to those generated by the at least one type of image rendering function for the entire image.

In an example embodiment, the method further comprises the step:

(v) disabling output of the image rendering component for a predetermined period of time following identification of a discrepancy at step (iv).

The drawing commands received by the interfacing component may relate to a single image frame period. In this context, step (i) comprises receiving drawing commands as received by or rendering commands as output by the interfacing component in respect of selected image frame periods and step (iii) comprises comparing image data generated at step (ii) with image data generated by, or derived from image data generated by the at least one type of image rendering function in respect of the same selected image frame periods.

In an example embodiment of the method, step (ii) further comprises calculating a cyclic redundancy check (CRC) value or digital signature on image data generated as a result of simulating the at least one type of image rendering function and step (iii) comprises comparing a CRC value or digital signature calculated at step (ii) with a CRC value or digital signature calculated on corresponding output by the at least one type of image rendering component.

In a further example embodiment, step (i) comprises receiving the drawing commands as received by the interfacing component and step (ii) comprises simulating the functionality of the interfacing component together with the at least one type of image rendering function.

To ensure the necessary standards are adhered to relating to the maximum allowable time period for displaying falsely generated information, the time period between successive outputs from the comparison at step (iv) for the selected image frame periods is less than a predetermined time period.

In an example embodiment, the interfacing component is arranged to receive drawing commands in a selected subset of drawing commands defined in a predefined graphics standard and wherein the at least one image rendering function implements only the rendering functionality necessary to generate images definable using the selected subset of drawing commands.

DESCRIPTION OF THE DRAWINGS

Example embodiments of the present invention will now be described in more detail with reference to the accompanying drawings, of which:

FIG. 6 shows a functional block representation of an alternative implementation of the image generator of FIG. 5 having an Integrity Monitor with increased functionality, according to an example embodiment of the present invention.

DETAILED DESCRIPTION

Display systems intended for avionic use, in particular those likely to be displaying primary flight information, are required to meet stringent safety standards and be certified for such use. Demonstration of a systems' compliance with such standards may be an extremely time-consuming exercise, the cost increasing with the complexity of the system.

A conventional implementation of an image generator may involve the use of a readily available but proprietary graphics processor unit (GPU). However, while such a device is more than capable of generating imagery at a rate required for avionics applications, such a device is typically more complex than required for the relatively simple imagery preferred when displaying flight information. The complexity of a GPU implies that the cost of certification of such a device for avionics use would be prohibitively high for an implementer of an avionics display system, even assuming that sufficient information on the working of the GPU would be available from the proprietor to satisfy the certification authorities as to its reliability.

An alternative, simpler implementation of an avionics display system involves a combination of bespoke software executing on a conventional processor and hardware logic devices such as field-programmable gate array (FPGA) devices to accelerate certain graphics rendering functions and so help to achieve necessary performance requirements. However, while the simpler and more accessible bespoke implementation provides an opportunity to certify the display system for avionics use at a reduced cost compared with one using conventional GPUs, certain additional innovations are required to achieve some of the more stretching performance requirements and to minimise the cost of certification, which even for such a bespoke implementation may be prohibitively high.

Figure 1:
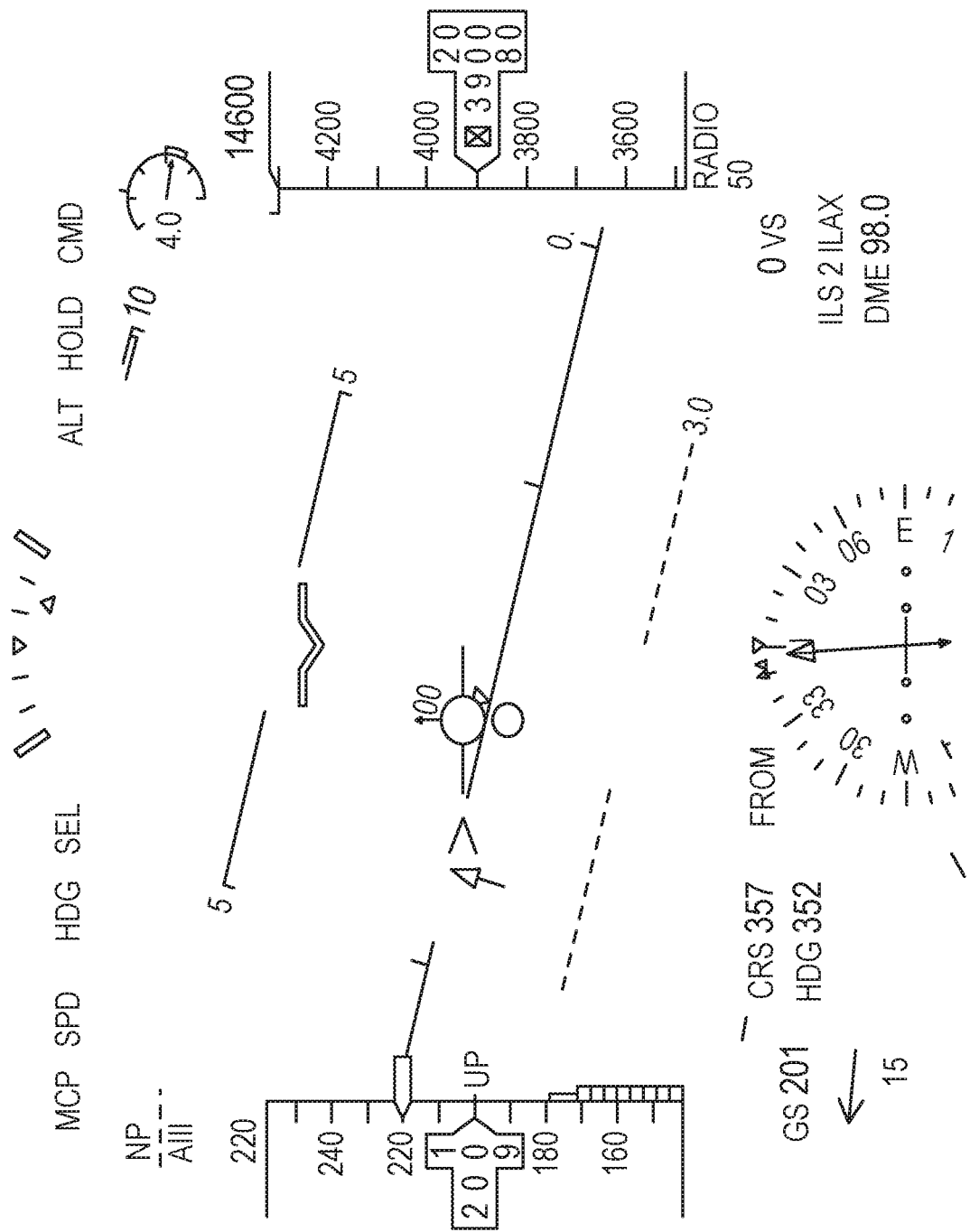
FIG. 1 shows an example image of numbers and symbols as may be displayed, in particular by a HUD, in avionic applications of the present invention.

The inventors of the present invention have recognised that in images of a type typically generated for display in avionic applications of transparent HUDs or HMDs, an example of a typical HUD image being shown in FIG. 1, up to 95% or more of the image area is likely to be of a background colour, e.g. black. Example embodiments of the present invention are designed to exploit this property to reduce the time required to render an image and to reduce the overall latency in generating images for display in avionic HUD/HMD systems in particular. In a typical such application images are generated at a frame rate of 50 or 60 Hz, that is, within a frame period or image refresh period of 20 ms or 16.667 ms, respectively. Within that frame period the present invention aims to reduce the time required to render an image in implementations typical of image generators in avionic display systems. The present invention may however provide advantages in applications other than avionic applications in which a significant proportion of the pixels in an image are to be displayed as a uniform predetermined background colour, whether the display is transparent or opaque.

Further innovations realised through certain design choices, as will be apparent from the description that follows, enable a relatively simple solution to be implemented to validate image rendering functionality of a display system incorporating the present invention, to avionic standards.

Example embodiments of an image generator according to the present invention will be described below comprising a bespoke software-implemented interfacing component, combined with a bespoke image rendering firmware component. Such an implementation enables a system designer to exercise full control over the selection of drawing commands or rendering commands that will be supported over the interfaces and the implementation of a corresponding selection of image rendering functionality. In particular, the image rendering functionality may be limited to the minimum required to generate images of the type expected in the applications intended. In this way, the implementation of an image generator is as simple as it can be, minimising the expected time and cost of certifying a display system incorporating such an image generator. Performance is also increased using innovative techniques to be described in detail below for the management of memory and of memory accesses to facilitate a reduction in the image rendering time in such an implementation.

Example embodiments of the present invention implement a selected subset of OpenGL standard drawing commands, comprising only those commands necessary for generating the types of image artefact typically displayed by avionic HUDs or HMDs. Details of the OpenGL standard may be found for example through the OpenGL foundation web site: www.opengl.org.

An example functional and processing architecture of an image generating apparatus according to an embodiment of the present invention will be described firstly with reference to FIG. 2.

Figure 2:
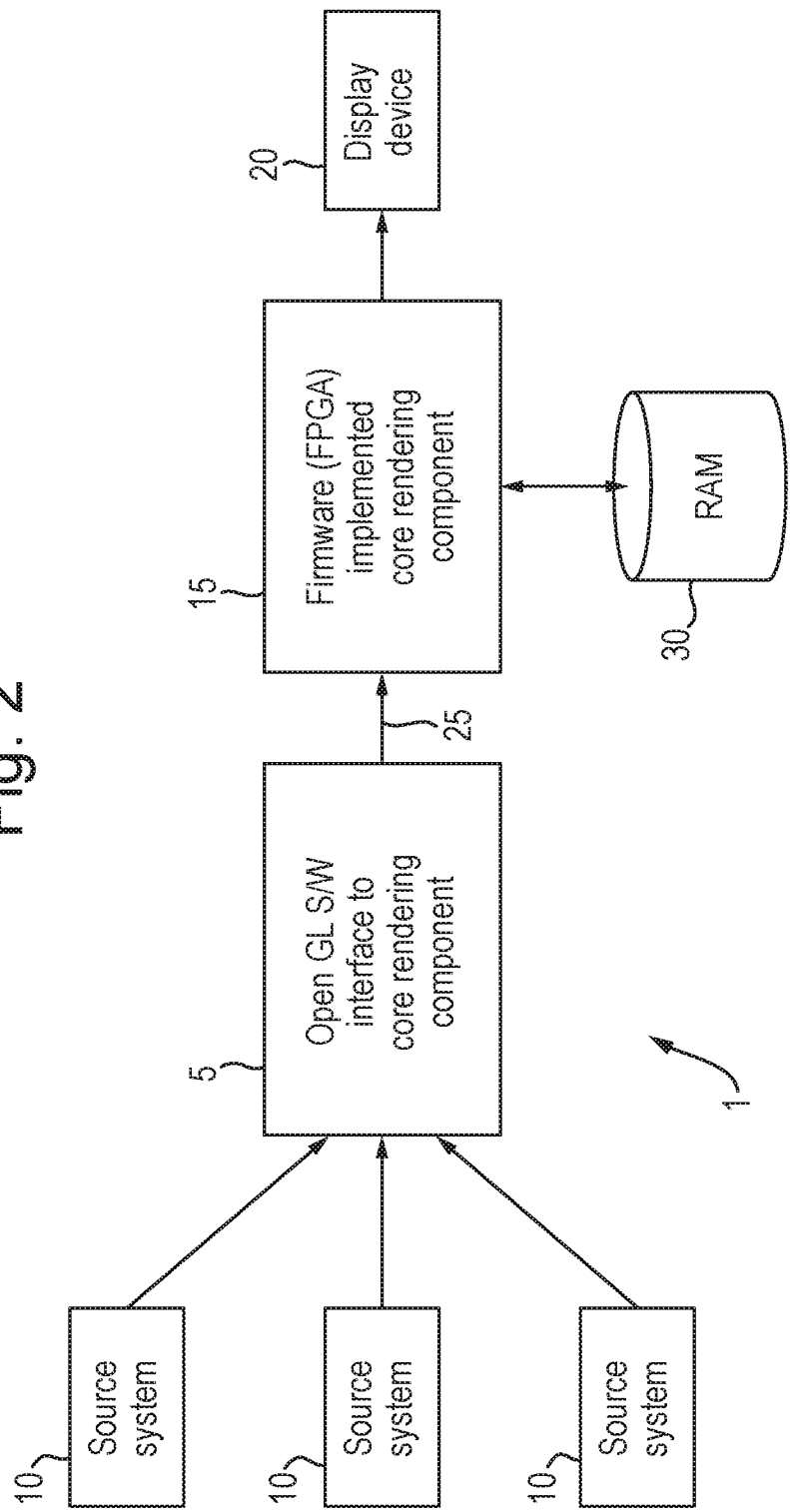
FIG. 2 shows in outline a functional block representation of an image generator according to an example embodiment of the present invention.

Referring to FIG. 2, an image generating apparatus 1 is shown comprising two main components: a software-implemented component executing on a digital processor 5, incorporating functionality to provide an interface to external systems 10 to receive (e.g. OpenGL) drawing commands defining symbols or other image artefacts and data to be displayed and to output corresponding image rendering commands; and a firmware-implemented component 15, comprising one or more field-programmable gate array (FPGA) devices or other types of programmable logic device configured to implement a selected range of image rendering operations corresponding to the range of image rendering commands that may be output by the processor 5. The firmware component 15 is configured as a range of image rendering modules responsive to received rendering commands to assemble an image as an array of pixels which, when output to a display device 20, enables artefacts defined by the received rendering commands to be displayed. The external systems 10 may for example include avionic systems executing an operational flight program arranged to output OpenGL commands or other standardised graphics language commands to define an image comprising data provided by aircraft sensors along with other predefined symbols.

Besides providing the interface to external systems 10, the processor 5 also provides an interface 25 to the firmware component 15. A predefined set of image rendering commands and other control commands is defined to control the functions of the firmware component 15. Functionality implemented in software executing on the processor 5 converts received drawing commands into commands selected from the predefined set and passes them over the interface 25. The firmware component 15 is configured to implement corresponding image rendering functions, for example those that would require a high processing bandwidth if implemented in software; specifically, image rendering functionality operating at a pixel level. The Processor 5 may implement lower bandwidth operations which, besides the interfacing functionality, include higher level drawing functionality relating to drawing primitives, e.g. lines and triangles, defined in received drawing commands. The Processor 5 may implement any defined transformations (e.g. translations, rotations, scaling) that are to be applied with knowledge of the vertices of a respective drawing primitive. However, certain of these transformations may also be implemented in the firmware component 15, for example the application of 3D rotations in vertex processing.

Besides converting drawing commands received from the external systems 10 into a series of rendering commands in the predefined set, the software-implemented functionality generates and interleaves other types of control command included in the predefined set, as required, including commands to control the general functioning of the firmware component 15 such as memory management commands, initialisation commands, and so on. A frame counter or other frame identifier may also be generated from the processor 5 and passed over the interface 25.

The image rendering commands define primitives to be drawn and the modes and effects to be applied, e.g. blending and texturing. The firmware component 15 implements an image rendering pipeline to render a defined image by manipulating the colour values of those pixels that will be involved in displaying the defined primitives. The firmware component 15 assembles data required to generate an image in frame buffers provided in external random access memory (RAM) 30.

The image generator 1 is arranged to operate on the principle that, for reasons of safety, a new image will be generated for each new frame period. Furthermore, in generating each new image frame, every pixel will be assumed to be of background colour, e.g. black, as specified by a rendering command received over the interface 25, unless otherwise defined or modified within the image rendering pipeline.

The functionality implemented by the Processor 5 and the firmware component 15 will now be described in more detail with reference to FIG. 3.

Figure 3:
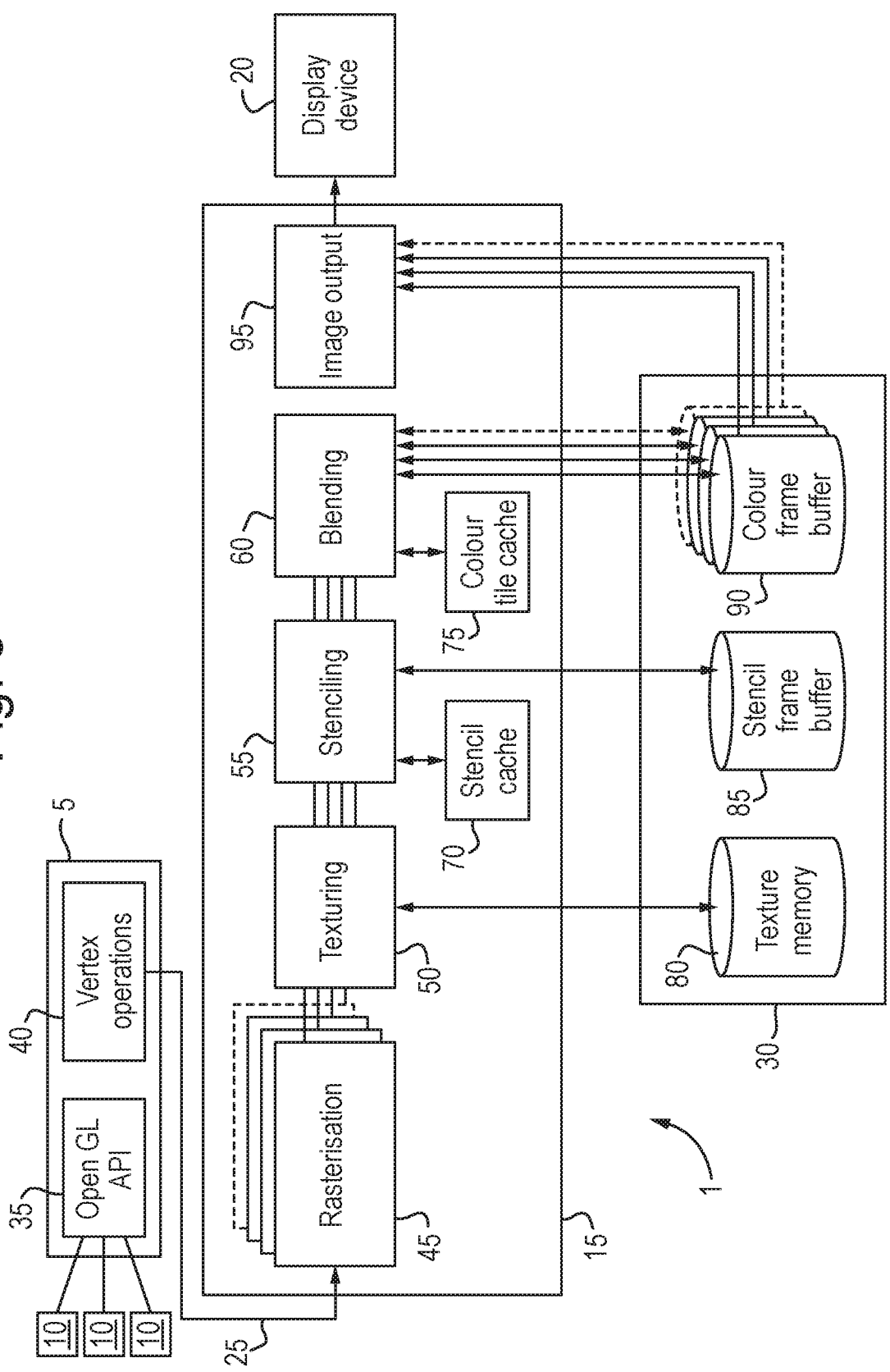
FIG. 3 shows in more detail a functional block representation of the image generator of FIG. 2, according to an example embodiment of the present invention.

Referring additionally to FIG. 3, a more detailed representation of the image generating apparatus 1 of FIG. 2 is shown. The processor 5 executes a software module 35 implementing an interface to the external systems 10, comprising an OpenGL application programmers' interface (API) for example. The OpenGL API 35 is arranged to support a selected subset of the OpenGL command set, appropriate to the drawing of images typical of the application to which the present invention is being directed. The processor 5 also executes a software module 40 dedicated to vertex-related operations. Such operations include identifying the vertices in drawing primitives, e.g. lines and triangles, defined in received OpenGL drawing commands and applying any defined rotation or scaling commands to reposition the vertices of the affected primitives. However, as mentioned above, these transformations may alternatively be applied in a module implemented in the firmware component 15. The module 40 generates rendering commands in the predefined set to specify the drawing primitives as they are defined and passes those rendering commands over the interface 25 to the firmware component 15. The rendering commands provide a geometric definition of each drawing primitive, interleaved with other rendering commands defining, for example, background colour, stencilling or blending modes to be applied. The module 40 may also generate and output a frame identifier for each image frame and output it to the interface 25, as required.

The firmware component 15 receives any commands generated by the Processor 5 over the interface 25 in a receiving module (not shown explicitly in FIG. 3) implemented in the firmware component 15 as part of the interface 25. The interfacing module passes details of each of the defined primitives to a Rasterisation module 45, or more than one Rasterisation module operating in parallel for greater throughput. The Rasterisation module 45 maps each defined primitive in the image to be generated to a pixel level rendition which it outputs as a stream of 'fragments' over a number of parallel pathways of the pipeline, each fragment containing the information needed to draw one pixel of a rasterised line, circle or polygon, for example. As the stream of fragments passes along the parallel pathways of the pipeline, pixel-level image rendering modules implemented within the firmware component 15 have the opportunity to modify the pixel data of each fragment as they arrive over one of the pathways In an example embodiment, the rendering modules include:

a Texturing module 50, used to apply textures to drawing primitives, in maps for example, or other filled graphics;

a Stencilling module 55, for applying defined regions of occlusion to an image; and a Blending module 60 for making appropriate pixel adjustments where lines or textured regions cross or overlap, for example.

A different combination of image rendering modules and effects may be implemented by the firmware component 15 in other example embodiments if required. Example variations include:

adding a module to implement the OpenGL depth buffer;
removing the Texturing module 50;
removing the Stencilling module 55;
adding a Scissoring module between the Texturing module 50 and the Stencilling module 55; and
implementing certain functionality of the Vertex Operations module 40 in a module of the firmware component 15, in particular the function of applying any defined transformations to defined primitives, rather than in software executing on the processor 5 (as shown in FIG. 3).

The Texturing module 50 is provided with access as required to a Texture Memory 80 in the external RAM 30. The Stencilling module 55 is provided with its own Stencil Cache 70 within the firmware component 15 and with access to a Stencil Frame Buffer 85 in the external RAM 30 in which stencilling data may be assembled as rendering progresses. The Blending module 60 is also provided with its own Colour Tile Cache 75 and with access to one or more Colour Frame Buffers 90, typically two or three, in the external RAM 30 in which final colour image components may be assembled as rendering progresses. A technique for using these cache memories 70, 75 in such a way as to decrease image rendering time through a reduced need to access the Frame Buffers in external RAM 30 will be described below according to an example embodiment of the present invention.

When the various rendering operations are complete for a current frame period, an Image Output module 95 is triggered to assemble a complete pixel-level image definition from the contents of the Colour Frame Buffer 90. The assembled image data are then output for use directly or indirectly by the display device 20 to display the generated image. Provision of multiple Colour Frame Buffers 90 enables the Image Output module 95 to retrieve final image data, built up in one Colour Frame Buffer 90, while the rendering modules are generating the image for the next frame period using another Colour Frame Buffer 90. In this way, the image rendering pipeline is not unduly delayed by the final assembly and transfer of image data to the display device 20.

The inventors have carried out some detailed analysis, modelling the likely proportion of an image that needs to be updated from one frame period to the next in typical avionic display applications. This analysis has determined the likely requirement for read/write/modify operations upon pixels in an image area and the opportunities to make use of one or more cache memories internal to the firmware component 15 to reduce the need for accessing external memory. Inspired by this analysis, the inventors have selected a division of an image area, typically of 1280×1024 pixels, into so-called 'tiles'—non-overlapping blocks of pixels—on which to base the operation of the different rendering modules 50, 55 and 60. The tile size that appears to be best for cache management purposes is one of 64 pixels. The arrangement of those 64 pixels that appears to provide a satisfactory compromise between maximising the probability that more than one of the pixels to be modified in a rendering operation is within the same tile (as would be achieved with an 8×8 arrangement) and maximising the data transfer rate to and from external memory (as would be achieved with a 64×1 arrangement), is a 16×4 pixel arrangement. This gives a division of the image area in this example into 80×256 tiles. Furthermore, a satisfactory compromise in dimensioning the cache memory 70, 75 has been selected, based upon an analysis of the likely re-load rates from external RAM for different cache sizes versus the amount of internal memory capacity required in the FPGA to hold the cache cells. A compromise cache size of 32 cache cells has been selected, each cache cell able to store image data for one tile. The Stencil Cache 70 and Stencil Frame Buffer 85 may each store stencilling data comprising 8 bits per pixel (bpp) and the Colour Cache 75 and the Colour Frame Buffers 90 may each store colour image data comprising one of 8 bpp (monochrome), 16 bpp (e.g. RGB 565) or 32 bpp (RGBA colour).

To facilitate a fastest possible transfer of data between a cache and a respective frame buffer in the external RAM 30, image data for the pixels of a tile are stored, whether in the cache or in the frame buffer, in a linear sequence. That is, the image data for a tile are stored at consecutive memory locations or otherwise such that when the image data for pixels in any tile are written to or read from the external RAM 30 this may be effected as a 'burst' transfer of data—typically of 64 bytes for a tile of data between the Stencil Cache 70 and the Stencil Frame Buffer 85 and one of 64, 128 or 256 bytes between the Colour Tile Cache 75 and one of the Colour Frame Buffers 90. By selecting a double data rate (DDR) type of memory device for the external RAM 30, this burst data transfer facility may be exploited to greatest advantage. Moreover, the reduced requirement for accesses to the external RAM 30 enables a typical DDR memory device to be shared across some or all of the different rendering modules of the firmware component 15, reducing the overall number of devices required in a typical implementation. Other types of memory device may be used for the external RAM 30, for example a static random access memory (SRAM), e.g. a zero bus turnaround (ZBT) SRAM memory device. However, while an SRAM device may be easier to interface with from an FPGA device, it is generally of low storage capacity, typically only 2 to 8 MB, which may be less than the pre-allocated capacity required for the multiple Frame Buffers 85, 90 implemented in this first embodiment of the invention, in particular when double-buffering is required. However, a variation in the memory management functionality to enable the use of SRAM memory devices will be described later, below, in a further embodiment of the invention.

Besides defining an appropriate sub-division of the image area and dimensioning of cache memories 70, 75, the following technique has been devised for making use of the cache memories 70, 75 in making changes to pixel states by each of the Stencilling module 55 and the Blending module 60. It is intended that each of those rendering modules 55, 60 applies the same technique in using their respective cache memories 70, 75 and frame buffers 85, 90. This technique will now be described in detail with reference to FIG. 4.

Figure 4:
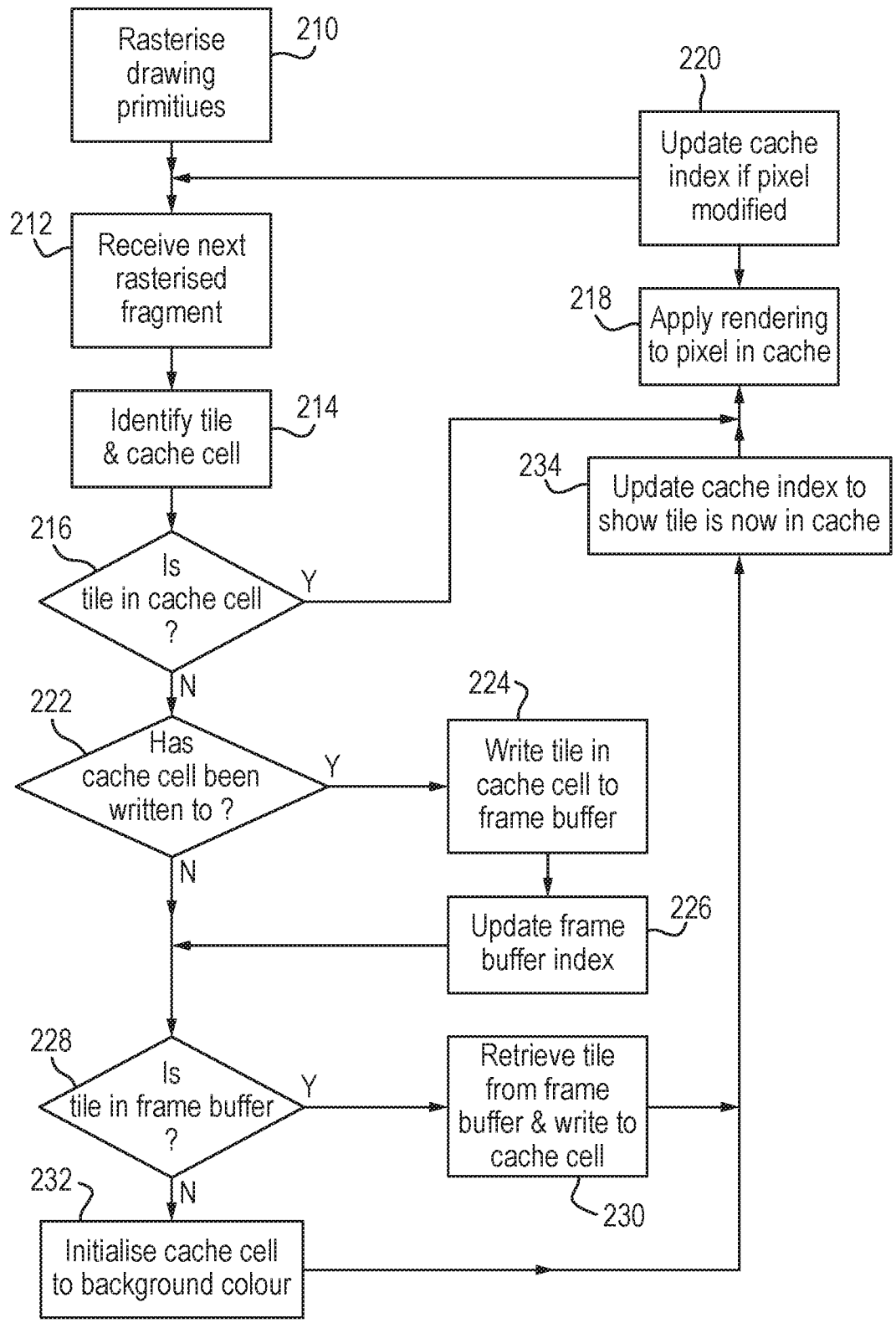
FIG. 4 is a flow chart showing steps in a process for rendering an image as may be used by an image rendering module in example embodiments of the present invention.

Referring additionally to FIG. 4, a flow chart is shown providing a conceptual sequential representation of the steps in what in practice is implemented as an image rendering process operating within a number of parallel pathways. The rendering modules of the firmware component 15 may act upon different fragments received along the different parallel pathways.

However, the main purpose in presenting the process shown in FIG. 4 as a sequential process is to highlight a process adopted by each of the Stencilling module 55 and the Blending module 60 in modifying pixels using their respective cache memory 70, 75. The following principles are applied by each module 55, 60 in this process:

(1) Any change to a pixel colour value will be made by a rendering module within its cache memory having first ensured that the respective tile is contained in the cache memory;

(2) A direct-mapped caching technique is used such that each tile may be stored in only one predetermined cell in the cache, the Y and X coordinates of the tile within an image area addressing scheme determining the cache cell in which to look for or to store the tile data;

(3) Before making a first change to a pixel within a tile during any frame period, the respective cache cell is initialised such that all pixels within the tile are set to be displayed with the background pixel colour;

(4) A tile will only be written to a respective frame buffer in the external RAM 30 if at least one pixel within the tile has been modified by a rendering module during the frame period to have, or to enable display with a non-background colour.

Applying these principles, the process shown in FIG. 4 includes a Step 210, an ongoing rasterisation step in which a stream of fragments is generated from the Rasterisation module(s) 45 in response to received rendering commands. Each fragment comprises the x and y coordinates of the respective pixel, the pixel colour, an identifier for the drawing primitive (allocated for example by the receiving module for the interface 25 to assist with synchronisation) of which the pixel is a part, and other information, for example depth information that may be used by rendering modules to define the pixel. The pixel colour may range in a scale of definition from a monochrome greyscale value in monochrome display applications through to a Red, Green, Blue and Alpha combination, the Alpha value being used to indicate a degree of transparency/blending to be applied to the pixel. The intention is that, as these fragments are passed along the image rendering pipeline, the way they are to be displayed may be modified by one or more of the image rendering modules, or not, as required. In parallel with this, any interleaved rendering commands received over the interface 25 for controlling currently selected stencilling; blending or scissoring modes for example, are passed directly to the respective rendering modules. Each module may then do what it is required to do according to the currently selected mode for the primitive for which the fragments have been rasterised, applying that mode when each respective fragment arrives over the pipeline.

At Step 212, a fragment output by the Rasterisation module(s) 45 is received by an image rendering module (55, 60) and, at Step 214, from the supplied (x,y) coordinate of the pixel, the coordinates of the respective image tile, say 'T1', are determined together with the direct-mapped cache cell, say 'C1', in which the tile 'T1' may be stored.

To enable a rapid determination of whether a tile is currently stored in the determined cache cell or the respective Frame Buffer and of the current state of a tile, two types of index are maintained by the rendering modules of the firmware component 15: a Cache Index associated with each Cache 70, 75 within the firmware component 15; and a Buffer Index associated with each Frame Buffer 85, 90 and stored in the external RAM 30. The Cache Indices are maintained respectively by the Stencilling module 55 and the Blending module 60 comprising a table for each of the possible 32 cells with the cache. The table for each cache cell includes the following information:

a flag to indicate whether the cell is in use (this flag may be cleared for a particular cache at the beginning of each new frame period by a command received over the interface 25, from the software component module 40 for example);

a flag to indicate, if the cell is in use, whether the tile within the cell has been modified since being loaded from the respective Frame Buffer 85, 90 or initialised;

the start address of the area allocated for storage of the tile in the respective Frame Buffer 85, 90. The address recorded indicates the tile start address relative to the first address of the Frame Buffer in the external RAM 30. This relative start address also uniquely identifies the tile being held in the cache cell.

The Buffer Index is updated by a rendering module in the event that a tile is written to the respective Frame Buffer. The Buffer Index comprises a single bit flag for each possible tile in the Frame Buffer, the flag being set to a '1' if the tile has been written to and to a '0' if all the pixels in the tile are to be displayed with the currently defined background colour. As mentioned above, a tile will only ever be written to the Frame Buffer, and a respective flag in the Buffer Index is set to a '1', if at least one pixel within the tile is to be or may be displayed with a non-background colour.

At the beginning of each frame period, the Cache Indices, and those Buffer Indices associated with the Frame Buffers to be used as the Stencil Frame Buffer 85 and the Colour Frame Buffer 90 during the frame period, are initialised by a command received over the interface 25. That is, the tables in the Cache Indices are set to nulls and all flags in the Buffer Indices are set to '0'. It is not necessary to initialise the contents of the Frame Buffers themselves as the respective buffer contents are overwritten by each new tile writing operation; the respective Buffer Index indicating whether there is anything new to be read from the Frame Buffer. The contents of the Cache cells will only be initialised as required during rendering.

If a tile is currently held in a cache cell, this combination of a Cache Index and a Buffer Index may be used to indicate one of three possible states for the tile:

1) all pixels in the tile are set to be displayed with the current background colour;

2) one or more pixels within the tile are currently set to, or may be displayed with a non-background colour, but none of those pixels has been modified since the tile was loaded into the cache cell from the respective Frame Buffer;

3) one or more pixels within the tile have been modified since the tile was initialised or loaded from the respective Frame Buffer.

Therefore, at Step 216 of the process in FIG. 4, the respective Cache Index is accessed to determine whether the tile T1 is currently stored in the cache cell C1, identifiable by the start address stored in the table in the cache cell index. If it is, then at Step 218 the image rendering module reads the currently stored image data for the pixel from the cache cell C1, modifies it if required and writes the image data back into the cache cell C1. If the image data for the pixel were modified to define or allow for a non-background colour, the Cache Index is updated at Step 220 (if not already indicating such a state), and the process then returns to Step 212 to receive the next fragment arriving over the pipeline. In practice, the next fragment arrives over a respective pathway in the pipeline unless the pipeline has been stalled while a rendering operation on another fragment in another parallel pathway completes.

If, at Step 216, the tile T1 is not currently stored in the cache cell C1 then there are two possibilities: either another tile, say tile T2, is currently stored in the cache cell C1 according to the start address stored in the cache cell table in the cache index; or no tile is currently stored in the cache cell C1. Thus, at Step 222, if the Cache Index indicates that a tile T2 is currently stored in cache cell C1 and the Cache Index shows that the cache data for tile T2 are written to during this frame period, then at Step 224 the tile T2 is written to the respective Frame Buffer 85, 90 as a burst transfer of data. The associated Buffer Index is updated to indicate that the tile T2 is now stored in the Frame Buffer and the process proceeds to Step 228.

At Step 228, with the cache cell now vacant, the Buffer Index is accessed to determine whether the tile T1 is currently stored in the Frame Buffer, as would be indicated by a '1' in the respective flag for the tile in the Buffer Index. If the tile T1 is stored in the Frame Buffer, then the process advances to Step 230 at which the tile T1 is read from the Frame Buffer as a burst transfer of data and written to the cache cell C1. At Step 234 the Cache Index is updated, in this case to indicate that the tile T1 is now in the cache cell but has not yet been modified since being loaded from the Frame Buffer. The process then proceeds to Step 218 for the rendering module to perform any required read/modify/write operation on the image data for the pixel now stored in the cache.

If, at Step 228, the Buffer Index shows that the tile T1 is not currently stored in the Frame Buffer, then all pixels in the tile are currently assumed to be of background colour and, at Step 232, the contents of cache cell C1 are initialised to the background state. The process then resumes at Step 234 where, in this case, the cache index is updated to show that the initialised tile T1 is in the cache cell C1, but that all pixels are currently to be displayed with the background colour and the tile T1 has not yet been modified. The rendering module is then able to carry out any required modification to the pixel data, at Step 218, now that the tile T1 is in the cache.

When the rendering process shown in FIG. 4 has been completed by the rendering module for all the fragments received over the pipeline during a current frame period, there may be one or more tiles still held in the cache. The Cache Index is accessed to identify any of those tiles that have been modified while in the cache to have at least one pixel of, or enabled for display with a non-background colour. Those that have are written to the respective Frame Buffer. The Frame Buffer then holds the image data for only those tiles that include at least one pixel that is to be, or may be, displayed with a non-background colour and the associated Buffer Index identifies which tiles have that property. All other tiles are assumed to comprise pixels of the current background colour, as indicated by a '0' value assigned to each respective flag in the Buffer Index.

When each of the image rendering modules 50, 55, 60 has acted upon all the fragments received over the pipeline from the Rasterisation module(s) 45 and rendering is complete for a current frame period, the Image Output module 95 is triggered to begin to assemble the image data to be output to the Display Device 20. The Image Output module 95 uses the Buffer Index associated with a respective one of the Colour Frame Buffers 90, as mentioned above, to determine whether any tile data are to be read from the Colour Frame Buffer 90 or whether the respective pixels are to be set to the background colour.

It was indicated above that a different memory management technique may be implemented to enable the use of SRAM devices as the RAM 30 in place of DDR-type memory devices for frame buffering purposes. Whereas SRAM devices typically have a lower storage capacity than DDR devices, an SRAM is easier to interface to an FPGA and is therefore potentially easier to certify to avionic standards than a DDR memory implementation. However, a further innovation is required to enable the functional equivalent of the Stencil Frame Buffer 85 and the Colour Frame Buffers 90, in particular, to be implemented and managed using much smaller memory devices. Such an innovative implementation will now be described in a further embodiment of the invention.

In a first variation over the previously described embodiment, memory is reserved in the RAM 30 for a fixed number of tiles only, providing a pool of tile storage that may be used for frame buffering purposes by the Stencilling module 55 and the Blending module 60.

In the previous embodiment, each Frame Buffer 85, 90 included reserved space for all the possible tiles in the image area; in the example above for 80×256 tiles. However, in this further embodiment, space in the RAM 30 is reserved for a much smaller number of tiles, typically only 5% to 20% of the tiles in the image area, the number required depending upon the symbol content for the particular application. If double buffering is to be used, for example to satisfy the requirements of Colour Frame Buffers 90, then memory for two or more pools of tiles may be reserved, the amount of space for each pool being determined by the tile size (e.g. 64, 128 or 256 bytes) and the number of tiles in the pool.

As in the previous embodiment, the tiles are stored in the reserved tile pool in linear byte order so that a stored tile may be stored and retrieved using a sequence of addresses and the address of any particular tile relative to the start address of the pool may be determined by multiplication of a unique pool tile reference number, allocated sequentially for the tiles in the pool, by the tile size.

Having defined one or more pools of tile storage in the RAM 30, available for use by the Stencilling module 55 and by the Blending module 60 in place of pre-allocated storage for the Frame Buffers 85, 90 respectively, a corresponding variation is required to the composition of the Cache Index maintained by each of the Stencilling module 55 and the Blending module 60.

In the previous embodiment, each Cache Index stored a start address for the respective tile in the area of RAM 30 reserved for the respective Frame Buffer 85, 90. However, in this variant, the tile number that references the tile in the image area is stored in the Cache Index in place of the address allocated for the tile in the RAM 30. When a tile currently held in the cache 70, 75 has been written to by the respective Stencilling module 55 or Blending module 60 and is to be stored in a respective Frame Buffer 85, 90, the Stencilling or Blending module 55, 60 determines the reference of the next available tile in the pool of tile storage and calculates the address for storing the tile in the pre-allocated pool of tile storage based upon the determined tile reference. The cached tile is then written out to the RAM 30 beginning at the calculated address as a linear sequence of bytes.

The content of the Buffer Indices associated with the Frame Buffers 85, 90 are also modified. In the previous embodiment, a 1-bit Boolean flag was stored for every possible tile in the image area to indicate whether or not the tile had been written to and hence whether it was stored in the respective Frame Buffer 85, 90. In this variant, the pool tile reference allocated when the cached tile was written to RAM 30 is stored in addition to or in place of the Boolean flag in the respective Buffer Index record. If the Boolean flag is retained, then the flag is used as previously to indicate whether the tile has been written to by the Stencilling or Blending module 55, 60 and the stored pool tile reference enables the address in the tile pool storage to be determined.

During initialisation for each new frame period, only the Boolean Flags need to be initialised in the Buffer Indices as the pool tile reference will be over-written in the event that a tile is modified and stored in the RAM 30.

If the pool tile reference replaces the Boolean flag, then the presence of a pool tile reference indicates that the tile has been written to by the Stencilling or Blending module 55, 60 and enables the address in the tile pool storage to be determined. If the tile has not been written to while in the Cache 70, 75, then the Buffer Index entry remains blank, as initialised for this implementation variant for each new frame period. In either case, the Buffer Index associated with the respective module 55, 60 provides a cross reference between a tile in the image area, one of 80×256 tiles, and, if written to, the allocated pool tile reference, used to define the start address in the pool of tile storage where the tile data are stored, the Buffer Index acting as an indirection index to the stored tile data. In this way, tile storage space in the RAM 30 is only used to store those tiles that contain pixels to be changed from the default background colour. In the previous embodiment, Frame Buffer (85, 90) storage space was reserved for all the tiles in the image area, e.g. 80×256 tiles, whether or not they had been written to during rendering.

Referring again to FIG. 4, the process described above with reference to FIG. 4 is modified slightly for this variant so that, at Step 224, when it is decided to write a modified tile from the cache cell to the RAM 30, the next available tile from the pool of tile storage is determined and, from the reference number of the allocated pool tile, the address of the tile in the pool is calculated. The tile is then written to the RAM 30 beginning at the calculated address. At Step 226, the Frame Buffer is updated by writing the allocated pool tile reference into the index entry for the corresponding tile in the image area and setting the Boolean flag, if present.

When assembling the final image for output, the Image Output module 95 accesses the Buffer Index for the Colour Frame Buffer 90, in particular, reads the Boolean flag for each tile in the image area and, if present and set, reads the associated pool tile reference and calculates the address in the pool tile storage from where the respective tile data may be retrieved. If the Boolean flag is not included in the Buffer Index, then the presence of a pool tile reference in the Buffer Index for a tile indicates that the tile has been modified during rendering and, using that reference, the Image Output module 95 determines the address of the stored tile data and retrieves it.

Where embodiments of the present invention are to be applied to systems displaying safety-critical information, relevant standards may apply to the performance of such systems. Demonstrable compliance with such standards may be a prerequisite for use of the system in such applications. In the case of avionic displays, particularly those displaying primary flight data likely to be relied upon by a pilot, the applicable standards, published by the Radio Technical Commission for Aeronautics (RTCA) Incorporated, are DO-254, as applied to complex electronic hardware (such as FPGAs or application-specific integrated circuits ASICs) and DO-178B/C, as applied to software. Both standards have 5 levels of Design Assurance Level (DAL) from DAL A (the highest) down to DAL E. DAL A is typically applied to a primary flight instrument, whereas DAL C may be applied to a secondary instrument; the applicable DAL level depending upon the effect on the aircraft operation of a failure. Both DO-254 and DO-178 are based upon independent test and review of the firmware/software when operating in its representative environment. DAL A requires 100% modified condition/decision coverage (MC/DC). For DAL C, testing is required to achieve 100% requirements coverage. In the case of an implementation using firmware such as in an FPGA, these conditions all need to be tested in-situ from the pins of the device; for software the compiled object code must be tested.

In a typical implementation of the image rendering components of the present invention in a firmware component 15 such as an FPGA, the functional design is defined using approximately 30,000 lines of code in a hardware description language such as VHDL. To certify the full functional design of such a device to the DAL A standard would be a very costly exercise. However, the inventors have devised a technique to enable the image generation system of the present invention to be assured to DAL A overall without necessarily imposing a need for DAL A certification of the design of the FPGA component 15 taken in isolation. The applicable level of assurance required for the FPGA component depends upon the safety risk it poses, in particular the probability of it generating "Hazardously Misleading Information (HMI)" and of that information remaining visible on the associated display for longer than a defined short time period, e.g. 0.5 s.

As mentioned above, the image rendering component 15 necessarily implements functionality other than drawing functions. These other functions are also defined in the approximately 30,000 lines of VHDL code. Recognising this, and taking advantage of the fact that the chosen FPGA implementation has enabled the inventors to have full control over the mathematical details of the rendering algorithms implemented by the various rendering modules, the inventors have been able to implement an entirely independent software-implemented simulation of only the image rendering functionality of the firmware component 15. This rendering simulator is arranged to receive the same rendering commands as received by the firmware component 15 over the interface 25 or to receive drawing commands from a point further back in the system, for example from the OpenGL API 35 or from the external Source Systems 10 directly, according to the safety case applicable. The rendering simulator generates from the received drawing or rendering commands a set of image data as would be output by the Image Output module 95 to control the Display Device 20, to bit-accuracy. The software-implemented Rendering Simulator—providing a key component of an independent Integrity Monitor—implements only the image rendering functions of the firmware component 15, not the entire range of functionality necessarily represented in the 30,000 lines of VHDL. The result is an entirely or substantially software-implemented Integrity Monitor able to validate the image rendering functionality of the firmware-implemented component 15 using only about 3000 lines of code in a programming language such as 'C'.

In a further example implementation, the functionality of the OpenGL API 35 and the drawing functions of the Vertex Operations module 40 may be replicated as modules within the Integrity Monitor 100 such that all the drawing functions of the image generator, according to example embodiments of the present invention described above, may be validated.

Attainment of the DAL A level of assurance in such a system requires only that the Integrity Monitor be certified to DAL A while the firmware component 15 and the functionality implemented on the processor 5 may need only to be certified to the lesser DAL C. Furthermore, any complexity in the implementation of the Integrity Monitor is much reduced by the design choice in example embodiments of the present invention to implement only a necessary subset of the OpenGL drawings commands, essential to the rendering of image artefacts to be displayed in avionic HUDs or HMDs. This is an example of an application in which efforts both to reduce image-rendering latency and to enable design assurance to the required level has both incurred a potential burden—the potential need to certify a complex firmware component to DAL A—but at the same time provided an opportunity to reduce that burden by enabling a relatively simple software-implemented Integrity Monitor to be developed along-side which can more easily be assured to the higher level.

Functionality of the Integrity Monitor according to further example embodiments of the present invention will now be described in more detail with reference to FIG. 5 and to FIG. 6.

Figure 5:
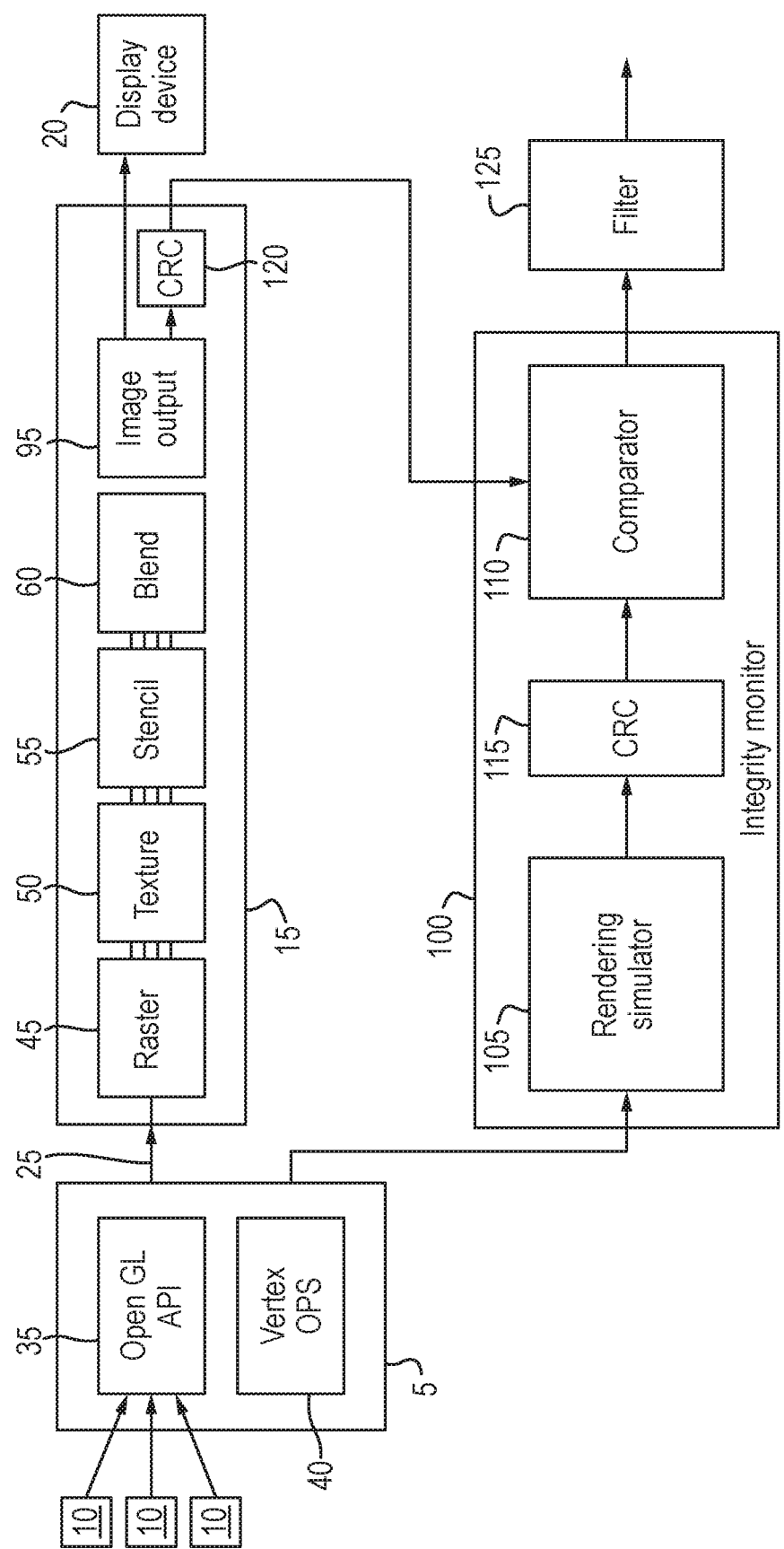
FIG. 5 shows a functional block representation of the image generator of FIG. 3 further comprising functional elements of an Integrity Monitor as may be included in the image generator according to example embodiments of the present invention.

Referring firstly to FIG. 5, a functional block diagram is provided showing the interfacing component 5, the firmware image rendering component 15 and an associated Integrity Monitor component 100 comprising two main sub-components—a software-implemented Rendering Simulator 105 and a Comparator module 110. As discussed above, the Integrity Monitor 100 is arranged to take, specifically, the rendering commands output by the interfacing component 5 in respect of a selected frame period and to generate what is intended to be a bit-accurate set of image data as would be output to the Display Device 20 by the firmware component 15 for that frame period. The Comparator module 110 is arranged to compare the image data output by the firmware component 15 with the image data generated by the Rendering Simulator 105 and to output a signal indicating a match or a discrepancy.

Being software-implemented, the Rendering Simulator 105 is likely to require a longer period of time to render an image as compared with the typical 4 ms of the firmware component 15. However as a design constraint, the Integrity Monitor 100 is required to detect a fault in the image rendering functionality of the firmware component 15 within whatever time period is specified by the applicable standard. For example the standard may require that a fault in the generation of images displaying primary flight information is to be detected within 0.5 s of those flight data (intended for display) becoming available from the avionic systems of the aircraft, or it may require that an erroneous feature in an image (HMI) may persist on the display for no longer than 0.5 s before it is corrected or removed. To meet this standard, it is not necessary to check the image data generated by the firmware component 15 for every frame period, so long as what is visible on the display does not persist, if faultily generated, beyond the required time period. It would therefore be acceptable, for example, for the Integrity Monitor 100 to check one image frame every 100 ms, for example, corresponding to one image frame in every 5 or 6 images generated by the firmware component 15, assuming a frame rate of 50 or 60 Hz respectively. This would leave sufficient time to act upon the result, for example providing a warning signal to the pilot user that certain information cannot be displayed at that time.

The Integrity Monitor 100 is arranged to record an identifier, e.g. a frame number, for each frame period for which the Rendering Simulator 105 is to generate a corresponding image and the Comparator module 110 is arranged to record a corresponding identifier for each frame of image data output by the firmware component 15. The Comparator module 110 is then able to ensure that the image frames for the correct frame periods are selected and compared from all those output by the firmware component 15.

To enable the Comparator module 110 to perform a rapid comparison of two sets of image data, as an alternative to carrying out a bit-by-bit comparison of the two sets of image data, the Integrity Monitor 100 includes a cyclic redundancy check (CRC) calculator 115 to calculate one or more CRC values or other type of digital signature for the image data generated by the Rendering Simulator 105. An additional module of functionality may be included in the firmware component 15, for example in an output path from the Image Output module 95, to carry out the same CRC or digital signature calculation on each frame of image data output by the firmware component 15 and to output the calculated results to the Comparator module 110. Alternatively, the Comparator module may itself be arranged to calculate the CRC or digital signature on each frame of image data received from the firmware component 15 and/or the Rendering Simulator 105. In either case, the Comparator module 110 receives the frame identifier and the respectively calculated CRC values or digital signatures for image data generated by each of the Rendering Simulator 105 and the firmware component 15 and performs the comparison for the appropriate frames by comparing only the CRC values or digital signatures.

The output of the Comparator module 110 may be passed through a Filter 125 to block transitory 'nuisance' failures which would not generally have an impact on the safety of displayed information. The Filter 125 may be implemented as a module of the Integrity Monitor 100 or separately as shown in FIG. 5, for example in an input stage of a wider display system of which the image generator of the present invention is a part. The output of the Filter 125, if still indicating a discrepancy, is logged as a fault and the display may be blanked automatically to prevent display of the erroneous information.

The Comparator module 110 may be implemented as a separate module of the overall Integrity Monitor functional block shown in FIG. 5, either in a software implemented component executing on the same digital processor as the Rendering Simulator 105 or on a separate digital processor, or as a firmware component implemented using an FPGA, for example. However, whatever the implementation choice, it is likely that both elements will need to be included in any DAL A assessment.

It is intended in this implementation of the Integrity Monitor functionality that the entire set of image data for a selected frame period is compared and validated. However, it may be envisaged that in some applications a check of only selected elements of an image would be acceptable, according to the applicable safety case and availability of an appropriate set of image data for those elements during an image rendering process. This may allow a greater number of image frames to be checked. The elements selected for validation may also be changed over time to give wider scope to the validation checks without increasing the overall processing requirements or reducing the rate of checking image frames below a critical rate.

A variation on the implementation of the Integrity Monitor 100 referred to above will now be described in more detail with reference to FIG. 6.

Referring to FIG. 6, an Integrity Monitor 130 is provided with increased functionality, including all the functionality of the Integrity Monitor 100 described above with reference to FIG. 5, but with the addition of a module 135 implementing replicated functionality of the OpenGL API 35. Furthermore, a Rendering Simulator 140 implements drawing functionality of the Vertex Operations module 40 in addition to having the functionality of the Rendering Simulator 100 of FIG. 5 simulating the rendering functionality implemented by the firmware component 15.

The bases for image comparison by a Comparator module 110 and the use of a Filter 125 remain as for the FIG. 5 embodiment.

While the present invention has been described and illustrated with reference to particular embodiments, it will be appreciated by those of ordinary skill in the art that the invention lends itself to many different variations not specifically illustrated herein. By way of example only, certain possible variations will now be described.

Embodiments of the present invention may make use of multiple similar caches/frame buffer arrangements in series or in parallel, ordered according to the image rendering requirements. Different designs may utilise different tile sizes, different tile aspect ratios, different numbers of cache cells, etc. The variations in the design may be made to tune a system for different primary drawing patterns, different levels of complexity in displayed images, different image refresh rates and proportions of the image being updated, etc.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. An image generator, configured to generate digital image data defining pixels of an image to be displayed according to one or more commands, the image generator comprising:
    an image rendering component comprising an arrangement of one or more configurable firmware devices configured to implement at least one image rendering function and to generate the digital image data according to said one or more commands; and
    an integrity monitor configured to detect a fault in the at least one image rendering function of the one or more configurable firmware devices within a time period specified by an applicable standard, the integrity monitor comprising
        a digital processor and a computer program which, when executed by the digital processor, causes the digital processor
            to simulate the at least one image rendering function implemented by the one or more configurable firmware devices of the image rendering component, and
            to generate, using the simulated at least one image rendering function, simulated digital image data defining pixels in an image to be displayed according to said one or more commands; and
        a comparator configured to compare the digital image data generated by the image rendering component and the simulated digital image data generated by the integrity monitor, thereby to determine the operating integrity of the image rendering component.

2. The image generator according to claim 1, wherein the integrity monitor is arranged to simulate the at least one image rendering function of the image rendering component and to generate the simulated digital image data to a data bit-level of accuracy and the comparator is arranged to perform a bit-level comparison of the digital image data generated by the image rendering component with the simulated digital image data generated by the integrity monitor and to indicate a potential fault with the image rendering component if the comparison identifies a bit-level discrepancy in the compared data.

3. The image generator according to claim 2, wherein the comparator is configured to calculate cyclic redundancy check (CRC) values for each of the digital image data generated by the image rendering component and the simulated digital image data and to compare the calculated CRC values.

4. The image generator according to claim 2, wherein the comparator is configured to calculate digital signatures for each of the digital image data generated by the image rendering component and the simulated digital image data and to compare the calculated digital signatures.

5. The image generator according to claim 1, wherein the image generator is configured to receive drawing commands in a predetermined set of drawing commands and to generate the digital image data defining pixels of the image to be displayed according to the received drawing commands, wherein said received drawing commands relate to a single image frame and wherein respective said drawing commands are received for each in a sequence of image frames, the image rendering component being configured to generate the digital image data according to said received drawing commands for each image frame in the sequence of image frames, and the integrity monitor being arranged to generate the simulated digital image data according to said drawing commands received for selected image frames of the sequence of image frames such that the time interval between successive said selected image frames does not exceed the time limit specified by the applicable standard.

6. The image generator according to claim 1, wherein the image generator is configured to receive drawing commands in a predetermined set of drawing commands and to generate the digital image data defining pixels of the image to be displayed according to the received drawing commands, the image generator further comprising an interfacing component configured to receive the drawing commands and to generate image rendering commands based on the received drawing commands, wherein the image rendering commands are generated by the interfacing component in a predefined image rendering command set and wherein the computer program, when executed on the digital processor, causes the digital processor:
    to simulate the generating by the interfacing component of image rendering commands in the predefined image rendering command set;
    to use the simulated generating of the image rendering commands in the predefined image rendering command set to generate simulated respective image rendering commands in the predefined image rendering command set; and
    to generate the simulated digital image data defining pixels in an image to be displayed using said respective simulated image rendering commands.

7. The image generator according to claim 1, configured, if the comparator identifies a discrepancy, to disable operation of the image rendering component.

8. A method for determining the accuracy of image data generated by an image generator, the method comprising:
(i) generating digital image data according to one or more commands using an arrangement of one or more configurable firmware devices implementing at least one image rendering function of a known design;
(ii) simulating, using a digital processor executing a computer program, the at least one image rendering function of the known design;
(iii) using the simulating at least one image rendering function from (ii) to generate simulated digital image data according to said one or more commands;
(iv) comparing the generated digital image data generated at (i) with the simulated digital image data generated at (iii); and
(v) based on the comparing at (iv), detect a fault in the at least one image rendering function of the one or more configurable firmware devices within a time period specified by an applicable standard.

9. The method according to claim 8, wherein (ii) comprises simulating the at least one image rendering function of the known design to generate simulated digital image data to a data bit-level of accuracy, and (iv) comprises performing a bit-level comparison of the digital image data generated at (i) with the simulated digital image data generated at (iii).

10. The method according to claim 9, wherein (iv) comprises calculating a cyclic redundancy check (CRC) value for each of the generated digital image data from (i) and the simulated digital image data from (iii) and comparing the calculated CRC values.

11. The method according to claim 9, wherein (iv) comprises calculating a digital signature for each of the generated digital image data from (i) and the simulated digital image data from (iii) and comparing the calculated digital signatures.

12. The method according to claim 8, wherein said one or more commands are drawing commands that relate to a single image frame and respective said drawing commands are received for each in a sequence of image frames, and wherein (i) comprises generating the digital image data according to said drawing commands for each image frame in the sequence of image frames and (iii) comprises generating the simulated digital image data according to said received drawing commands for selected image frames of the sequence of image frames such that the time interval between successive said selected image frames does not exceed the time limit specified by the applicable standard.

13. The method according to claim 12, wherein:
(i) comprises receiving said drawing commands and generating therefrom respective image rendering commands in a predefined image rendering command set for output to the arrangement of one or more configurable firmware devices for use in said generating digital image data according to said received drawing commands;
(ii) comprises simulating, using the digital processor executing the computer program, said generating of image rendering commands in the predefined image rendering command set; and
(iii) comprises using the simulated generating of image rendering commands from (ii) to generate, from said drawing commands, simulated respective image rendering commands in the predefined image rendering command set and generating the simulated digital image data using said simulated respective image rendering commands.

14. The method according to claim 8, comprising: upon identifying, at (iv), a discrepancy between the generated digital image data generated at (i) and the simulated digital image data generated at (iii), halting the generating of digital image data by the arrangement of one or more configurable firmware devices.

15. A head-up, head-mounted or helmet-mounted display system including the image generator according to claim 1.

16. A head-up, head-mounted or helmet-mounted display system including the image generator according to claim 1, wherein the comparator is configured to:
calculate cyclic redundancy check (CRC) values for each of the digital image data generated by the image rendering component and the simulated digital image data and to compare the calculated CRC values; or
calculate digital signatures for each of the digital image data generated by the image rendering component and the simulated digital image data and to compare the calculated digital signatures.

17. A head-up, head-mounted or helmet-mounted display system including the image generator according to claim 5.

18. A head-up, head-mounted or helmet-mounted display system including the image generator according to claim 6.

19. An image generator, configured to receive one or more drawing commands in a predetermined set of commands and to generate digital image data defining pixels of an image to be displayed according to the received one or more commands, the image generator comprising:
an image rendering component comprising an arrangement of one or more configurable firmware devices configured to implement a range of functionalities, the range of functionalities including at least one image rendering function according to a known design and to generate the digital image data according to said received one or more commands; and
an integrity monitor configured to detect a fault in the at least one image rendering function of the one or more configurable firmware devices within a time period specified by an applicable standard, the integrity monitor comprising
a digital processor and a computer program configured to implement a subset of functionalities of the one or more configurable firmware devices rather than the entire range of functionalities, and which, when executed by the digital processor, causes the digital processor
to simulate the at least one image rendering function implemented according to the known design by the one or more configurable firmware devices of the image rendering component, and
to generate, using the simulated at least one image rendering function, simulated digital image data defining pixels in an image to be displayed according to said received one or more commands; and
a comparator configured to compare the digital image data generated by the image rendering component and the simulated digital image data generated by the integrity monitor, thereby to determine the operating integrity of the image rendering component.

20. The image generator of claim 19, wherein the integrity monitor is configured to validate only a subset of the digital image data generated by the image rendering component, for the applicable standard.

* * * * *